(12) United States Patent
Toyama et al.

(10) Patent No.: US 7,432,681 B2
(45) Date of Patent: Oct. 7, 2008

(54) SCANNER SYSTEM

(75) Inventors: Souichi Toyama, Ebina (JP); Haruaki Otsuki, Tsuchiura (JP); Atsushi Sakamoto, Tsuchiura (JP); Kenta Seki, Tsuchiura (JP); Yaichi Okubo, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 368 days.

(21) Appl. No.: 10/927,082

(22) Filed: Aug. 27, 2004

(65) Prior Publication Data
US 2005/0128553 A1 Jun. 16, 2005

(30) Foreign Application Priority Data
Dec. 12, 2003 (JP) ............................. 2003-415247

(51) Int. Cl.
G05B 11/42 (2006.01)
(52) U.S. Cl. ................... 318/610; 318/609; 318/560; 318/621; 700/14; 700/41; 700/45; 700/58; 700/59; 700/42; 700/43
(58) Field of Classification Search ................. 318/560, 318/609, 610, 621; 356/614, 622; 700/14, 700/41, 42, 43, 45, 58, 59
See application file for complete search history.

(56) References Cited

U.S. PATENT DOCUMENTS

| 4,432,083 A * | 2/1984 | Hsieh et al. | 369/44.11 |
|---|---|---|---|
| 4,435,798 A * | 3/1984 | Taub | 369/72 |
| 4,669,074 A * | 5/1987 | Hsieh et al. | 369/44.35 |
| 4,674,076 A * | 6/1987 | Hsieh et al. | 369/44.28 |
| 5,059,021 A * | 10/1991 | Spence et al. | 356/121 |
| 6,198,246 B1 * | 3/2001 | Yutkowitz | 318/561 |
| 6,218,803 B1 * | 4/2001 | Montagu et al. | 318/662 |
| 6,703,603 B2 * | 3/2004 | Tohyama et al. | 250/234 |
| 6,768,100 B1 * | 7/2004 | Brown | 250/231.13 |
| 7,035,694 B2 * | 4/2006 | Ramamoorthy et al. | 700/18 |
| 2003/0102427 A1 * | 6/2003 | Tohyama et al. | 250/234 |
| 2004/0135534 A1 * | 7/2004 | Cullen | 318/609 |

FOREIGN PATENT DOCUMENTS

| JP | 2000-28955 | 1/2000 |
|---|---|---|
| JP | 2002-196274 | 7/2002 |

* cited by examiner

Primary Examiner—Rita Leykin
(74) Attorney, Agent, or Firm—Crowell & Moring LLP

(57) ABSTRACT

A scanner system includes a servo control unit. A rotation angle of a rotating shaft supporting a mirror is detected, and an error of the detected value with respect to a commanded value is integrated by an integral compensator so that the detected value is able to track the commanded value. A tracking error proportional compensator is disposed in parallel with the integral compensator so as to add a correction value proportional to the error to the integrated value of the error. A plurality of gains are prepared for each of the integral compensator, the tracking error proportional compensator, a detected value proportional compensator and a detected value differential compensator of the servo control unit. Each gain is changed in accordance with a travel angle of the commanded value. Thus, the mirror can be positioned quickly so that the machining speed can be improved.

4 Claims, 4 Drawing Sheets

SCANNER SYSTEM

FIELD OF THE INVENTION

The present invention relates to a scanner system for detecting a rotation angle of a rotating shaft supporting a galvanometer mirror, and controlling the rotating shaft so as to position the galvanometer mirror in a desired angular position.

DESCRIPTION OF THE BACKGROUND ART

A scanner system is a device in which a rotating shaft supporting a galvanometer mirror (hereinafter referred to as "mirror") is rotated by a motor so that the reflective surface of the mirror is positioned at a desired angle. Thus, for example, a piece to be machined is irradiated at a predetermined position with a laser beam output from a laser oscillator. The scanner system is used in a laser perforating machine (hereinafter referred to as "laser machining apparatus") for manufacturing printed circuit boards.

In the laser machining apparatus, the speed (responsiveness) to position the mirror and the error thereof with respect to a commanded value have enormous influence on the machining throughput and the machining position accuracy. The machining throughput of the laser machining apparatus is typically not lower than 30,000 holes per minute (not lower than 500 holes per second), and the mirror is positioned in an average time of 1 ms or shorter. On the other hand, the machining position error is not larger than ±15 µm in the laser machining apparatus as a whole. In the whole error, the allocatable error to the scanner system is about several micrometers.

In order to achieve such a high speed and such a high accuracy in positioning the laser beam, the scanner system has a servo control unit for feedback control of the angle of the mirror.

An angle sensor for detecting the rotation angle of the rotating shaft is attached to the rotating shaft supporting the mirror. In the mirror positioning operation, the servo control unit operates so that a tracking error with respect to the commanded value is zero. The commanded value is a fixed value at a target angle position of the mirror. Therefore, in order to make the steady-state error zero, a so-called type-1 servo system is constituted by using a servo compensator having an integral characteristic in a low frequency range. The servo control system may be implemented by an analog servo system to be controlled by continuous time control with an analog operational circuit, or a digital servo system to be controlled by discrete time control with a program of a microprocessor. Further, if necessary, the both may be used together.

In the laser machining apparatus, the irradiation positions of a laser beam are converted into the target angle positions of the mirror based on the coordinate data of holes to be machined. An upper control unit performs this coordinate conversion, and sends the commanded values to the servo control unit. In addition, in order to synchronize the irradiation of the laser pulse with the positioning of the mirror, the upper control unit controls the timing when the commanded values are sent and the timing when the laser oscillator is actuated.

In the background art, there is disclosed a technique for controlling a scanner system in which the settling time is adjusted to suppress such a resonance that the operating frequency of the scanner system enters the resonance frequency band of the scanner system (JP-A-2000-28955).

In addition, there is disclosed a technique in which a servo control unit is constituted by a compensator of an analog circuit and a compensator of a digital computer, and the compensator of the analog circuit acts as a notch filter at the torsional natural frequency of a scanner so as to expand the control bandwidth (JP-A-2002-196274).

The servo control unit has to move and settle the mirror in a predetermined positioning time in response to a series of the commanded values (hereinafter referred to as "angle command pattern") sent in turn from the upper control unit. That is, in order to attain high-speed and high-accuracy laser machining, it is essential not only to make the steady-state error of the mirror angle zero simply but also to make the transient error of the settling operation (hereinafter referred to as "settling response") as small as possible, while a laser pulse is shot as soon as the error enters predetermined tolerance.

The servo control system has a plurality of natural modes defining its dynamic characteristic. Each natural mode of a dynamic system is characterized by the natural frequency of vibration and the damping ratio of the vibration, while each a periodic damping mode is characterized by its time constant.

In the case of the servo control system of the scanner system, the natural modes of the system as a whole is determined by the structural vibration characteristics of the scanner system to be controlled or the dynamic characteristics of the servo compensator. A mode having a low natural frequency or a long time constant has an influence on the low frequency characteristic of the frequency response transfer function of the servo control system. On the other hand, a mode having a high natural frequency or a short time constant has an influence on the high frequency characteristic. Particularly in the high frequency range, there are some modes caused by the structural vibrations, whose resonance points may be close to each other.

Further, the angle command pattern is not uniform, but is varied in mirror travel angle or time interval. The excited modes are different depending on the angle command patterns. Thus, the settling response varies. Accordingly, in order to improve the responsiveness of the scanner system, it is necessary to design the scanner system not to be affected by the variety of the angle command pattern.

SUMMARY OF THE INVENTION

It is an object of the present invention to provide a scanner system in which a mirror can be positioned quickly, and the machining speed can be improved.

In order to attain the foregoing object, according to the first configuration of the invention, a scanner system includes a servo control unit for detecting a rotation angle of a rotating shaft supporting a galvanometer mirror, and integrating an error of the detected value of the rotation angle with respect to a commanded value so as to make the detected value track the commanded value, wherein a correction value proportional to the error is added to the integrated value of the error.

According to the second configuration of the invention, a scanner system includes a servo control unit for detecting a rotation angle of a rotating shaft supporting a galvanometer mirror, and integrating an error of a detected value of the rotation angle with respect to a commanded value so as to make the detected value track the commanded value, wherein a plurality of gains of compensating units constituting the servo control unit are defined beforehand corresponding to travel angles of the galvanometer mirror, and the gains of the compensators are changed in accordance with the travel angle depending on the commanded value before the rotating shaft is rotated.

The mirror can be positioned quickly, and the machining speed can be improved. In addition, in spite of the variation of the angle command, the fluctuation in settling response of the galvanometer mirror can be suppressed so that the response can always be made quick.

PREFERRED EMBODIMENT OF THE INVENTION

Figure 1:
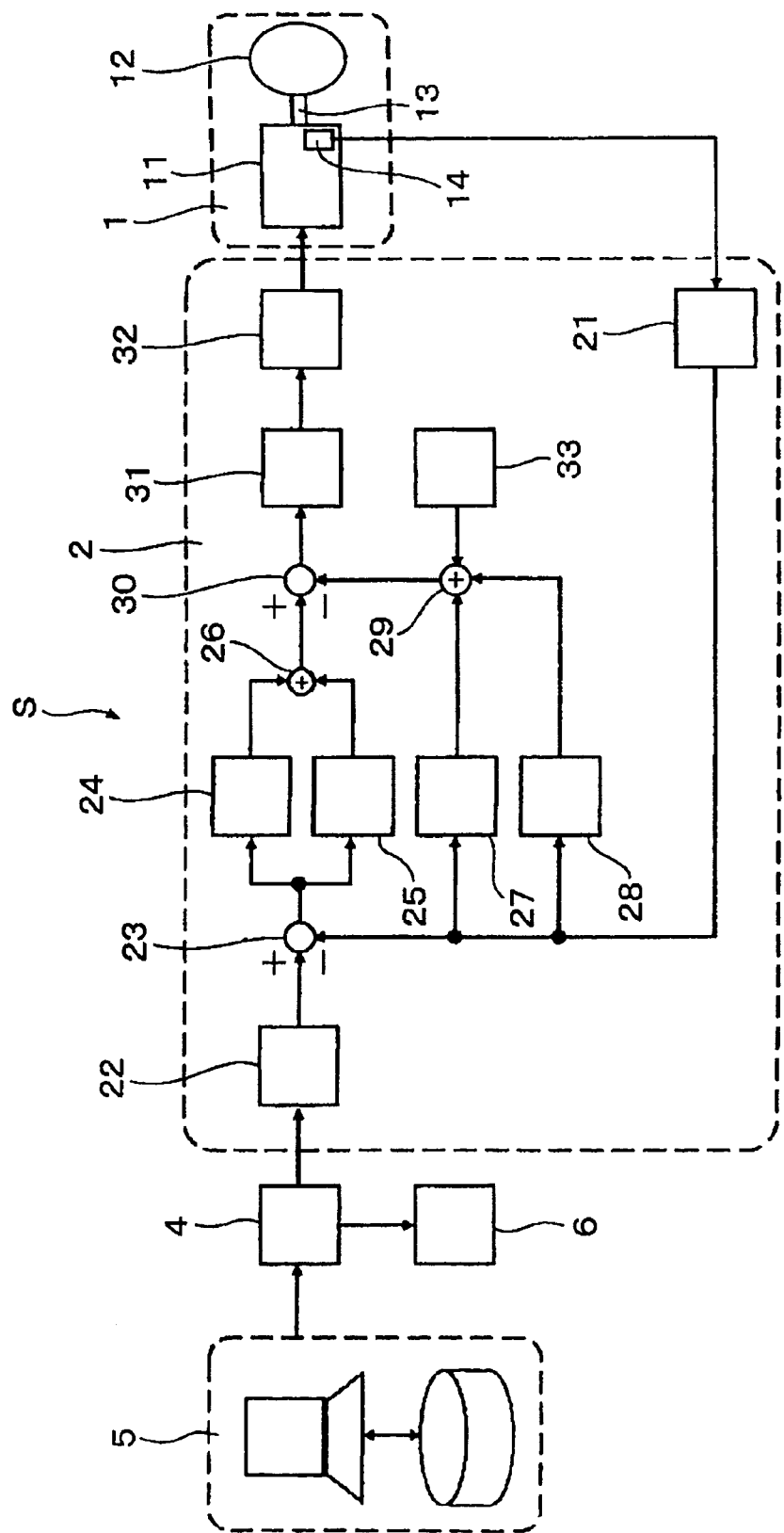
FIG. 1 is a block diagram of a laser machining apparatus having a scanner system according to the present invention.

The present invention will be described below with reference to an embodiment shown in the drawings.

FIG. 1 is a block diagram of a laser machining apparatus having a scanner system according to the present invention.

A control unit 5 of the laser machining apparatus outputs coordinate data of machining positions to an upper control unit 4 based on a machining program inputted to the control unit 5. The upper control unit 4 converts the inputted coordinate data into angle commanded values for controlling a mirror 12, and transmits the angle commanded values to a servo control unit 2. In this event, the upper control unit 4 controls the timing of transmitting the angle commanded values so as to synchronize them with pulses output from the laser oscillator 6.

A scanner system S in this embodiment is constituted by a trajectory generator 22, the servo control unit 2 and a scanner 1.

The trajectory generator 22 smoothly interpolates the step-like angle commanded values output from the upper control unit 4 so as to form a trajectory signal, and outputs the trajectory signal to the servo control unit 2.

The scanner 1 is constituted by a motor 11 and the mirror 12 fixed to a rotating shaft 13 of the motor 11. An angle sensor 14 for detecting the rotation angle of the rotating shaft 13 is built in the motor 11. A detection datum detected by the angle sensor 14 is inputted into an angle detection circuit 21, and output from the angle detection circuit 21 as a detected value. The motor 11 is controlled by the servo control unit 2.

Next, the configuration of the servo control unit 2 will be described.

The detected value outputted from the angle detection circuit 21 is inputted into a subtracter 23, a detected value proportional compensator 27 and a detected value differential compensator 28. In order to keep the stability of the feedback loop, the detected value proportional compensator 27 proportionally compensates the detected value, and the detected value differential compensator 28 differentially compensates the detected value.

The subtracter 23 calculates a tracking error which is a difference between the trajectory signal output from the trajectory generator 22 and the detected value, and outputs the result of the calculation to an integral compensator 24 and a tracking error proportional compensator 25 operating to make the tracking error zero.

An adder 26 adds the outputs of the integral compensator 24 and the tracking error proportional compensator 25 to each other, and outputs the result of the addition to a subtracter 30.

An adder 29 adds the outputs of the detected value proportional compensator 27, the detected value differential compensator 28 and the output of a constant value generating unit 33, and outputs the result of the addition to the subtracter 30. The operation of the constant value generating unit 33 will be described later.

The subtracter 30 subtracts the output of the adder 29 from the output of the adder 26 so that the outputs of the detected value proportional compensator 27 and the detected value differential compensator 28 serve as negative feedbacks. As a result, stabilization can be achieved while securing a sufficient phase margin around a gain cross frequency in a loop transfer function of the feedback loop.

The output of the subtracter 30 is supplied to a motor driving current control circuit 32 through a high frequency range stabilization compensator 31, so that a motor driving current corresponding to the output is supplied to the motor 11.

Next, the function of each constituent part of the servo control unit 2 will be described.

The integral compensator 24 integrates the tracking error. Accordingly, even when a step-like torque disturbance acts on the rotating shaft 13, the integral compensator 24 operates to make the steady-state value of the tracking error zero. However, it takes time to integrate the tracking error. Therefore, in the accelerating operation immediately after the beginning of movement of the mirror 12, rising of a controlling input to the motor 11 is so slow that the responsiveness as a transient characteristic of the servo control is difficult to increase.

According to the present invention, therefore, the rising of the controlling input is steeper by use of the tracking error proportional compensator 25. That is, since the response of the angle of the mirror 12 is delayed to the trajectory signal, there occurs a comparatively large tracking error immediately after the beginning of movement of the mirror 12. The tracking error proportional compensator 25 outputs a signal proportional to the tracking error at each time so that the rising of the controlling input at the time of acceleration can be steeper. Thus, the response can be made quicker.

In the high frequency range stabilization compensator 31, controlling notch filters having central frequencies at resonance frequencies each caused by torsional vibration modes of the rotating shaft, and cut-off notch filters for each cutting off intermediate frequencies between adjacent ones of the resonance frequencies are connected in series.

Here, each controlling notch filter is adjusted to have a central frequency corresponding to a resonance frequency and have a damping ratio of a transfer function numerator equal to the damping ratio of the resonance peak in order to reduce the influence of the resonance peak. Incidentally, the frequency and the damping ratio of the resonance peak can be measured by an FFT analyzer.

On the other hand, each cut-off notch filter is provided for securing enough stability in the control system when the peaks are close to each other. That is, when two resonance peaks are close to each other, their feet overlap each other at intermediate frequencies between the peaks so that the gain is increased there. When this frequency range is examined by use of the Nyquist stability criterion method, it is close to the so-called stability criterion of the coordinate value (−1, 0) on the complex plane, so that the gain margin is short. This tendency becomes more remarkable as the bandwidth of the control system is expanded. It is therefore impossible to secure enough stability in the control system only by the controlling notch filters in series.

Therefore, the cut-off notch filter for cutting off the intermediate frequency between the resonance peaks is connected in series with the controlling notch filters for reducing the resonance peaks. Since the cut-off notch filter is provided for increasing the gain margin, the cut-off notch filter has a broad and gradual cut-off characteristic in comparison with that of the controlling notch filter. A phase crossover frequency of the Nyquist trajectory is set as the central frequency of the cut-off notch filter. The parameters (damping ratios of the denominator and the numerator of the transfer function) of the cut-off characteristic are set to secure a gain margin of 7 dB or larger, preferably 10 dB or larger.

Figure 2A:
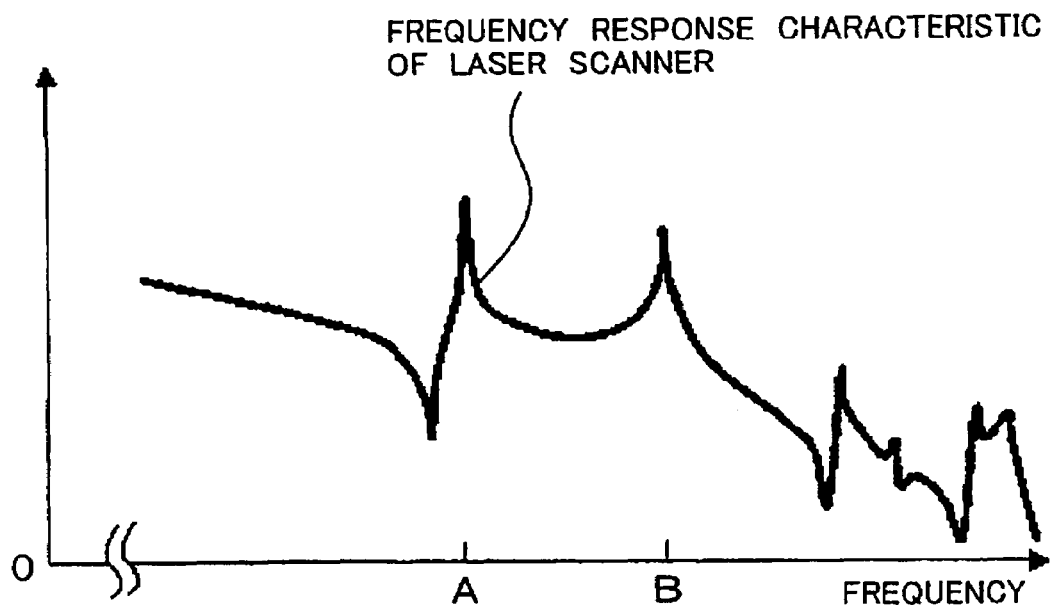
FIGS. 2A and 2B are graphs showing the frequency response characteristic of the scanner system according to the present invention.

That is, for example, assume that the transfer characteristic (gain characteristic) in the high frequency range of several kHz or more between the input of the motor driving current control circuit 32 and the output of the angle sensor 14 draws a curve having resonance points caused by torsional vibration modes of the rotating shaft as shown in FIG. 2A. In the case of the scanner system applied to the laser machining apparatus, two peaks, that is, the highest resonance peak (frequency A) and the second highest resonance peak (frequency B) have influence on the stability of the control system in a controlled device (laser scanner 1) having such a gain characteristic.

In such a case, therefore, controlling notch filters are provided for the frequency A and the frequency B respectively. In addition, since the frequency A and the frequency B are close to each other, a cut-off notch filter for cutting off at intermediate frequencies between the frequency A and the frequency B is connected.

Figure 2B:
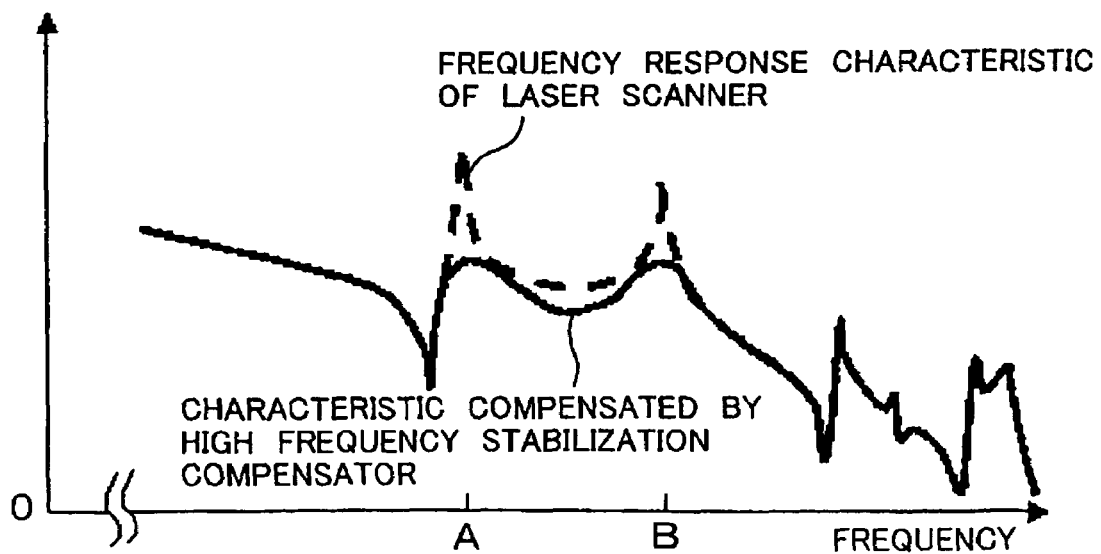

When the high frequency range stabilization compensator 31 configured thus is provided, the transfer characteristic (gain characteristic) between the input of the high frequency range stabilization compensator 31 and the output of the angle sensor 14 draws a curve shown by the solid line in FIG. 2B. Incidentally, the broken line in FIG. 2B shows the curve shown by the solid line in FIG. 2A. As is apparent from FIG. 2B, in the transfer characteristic when the high frequency range stabilization compensator 31 is provided, the gain is dropped at the two resonance peaks, and the gain is also dropped in the intermediate frequency between both. Thus, the frequency bandwidth of the servo control can be expanded stably.

Next, the effect obtained by providing the tracking error proportional compensator 25 and the high frequency range stabilization compensator 31 will be described.

Figure 3A:
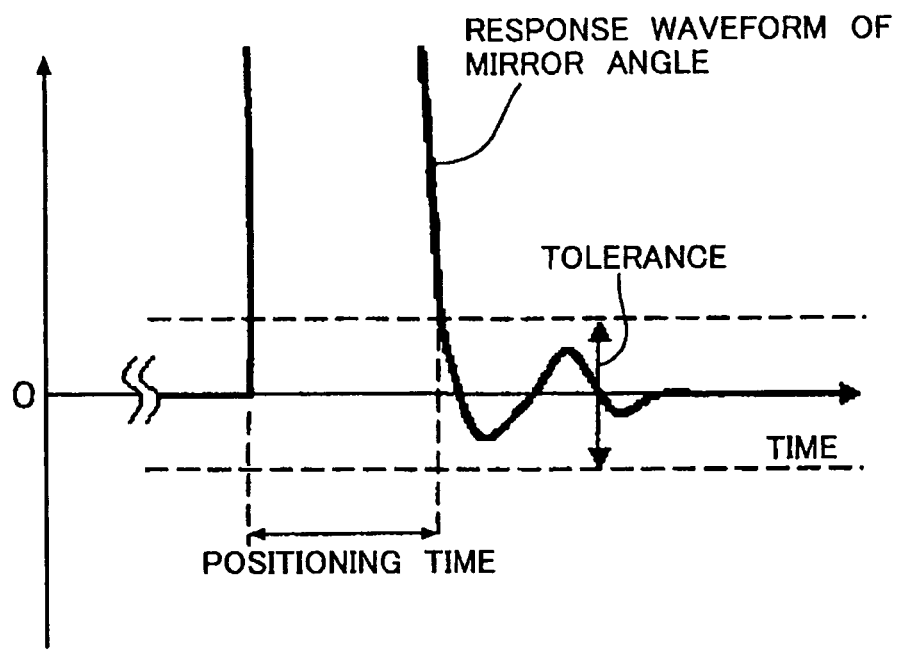
FIGS. 3A and 3B are graphs showing the characteristic of the scanner system according to the present invention.
Figure 3B:
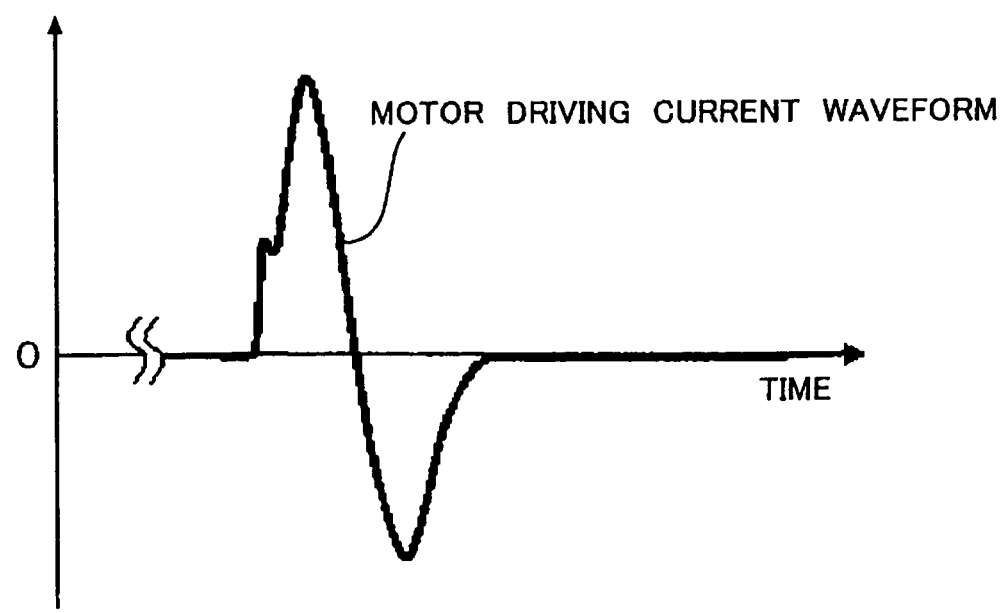
Figure 4A:
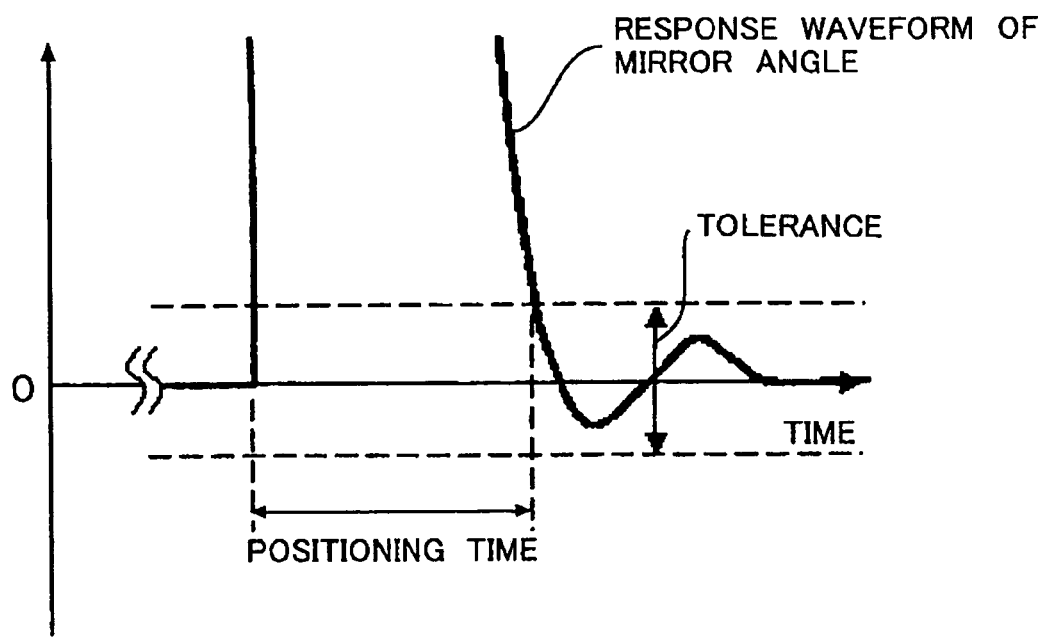
FIGS. 4A and 4B are graphs showing the characteristic of a scanner system in the background art.
Figure 4B:
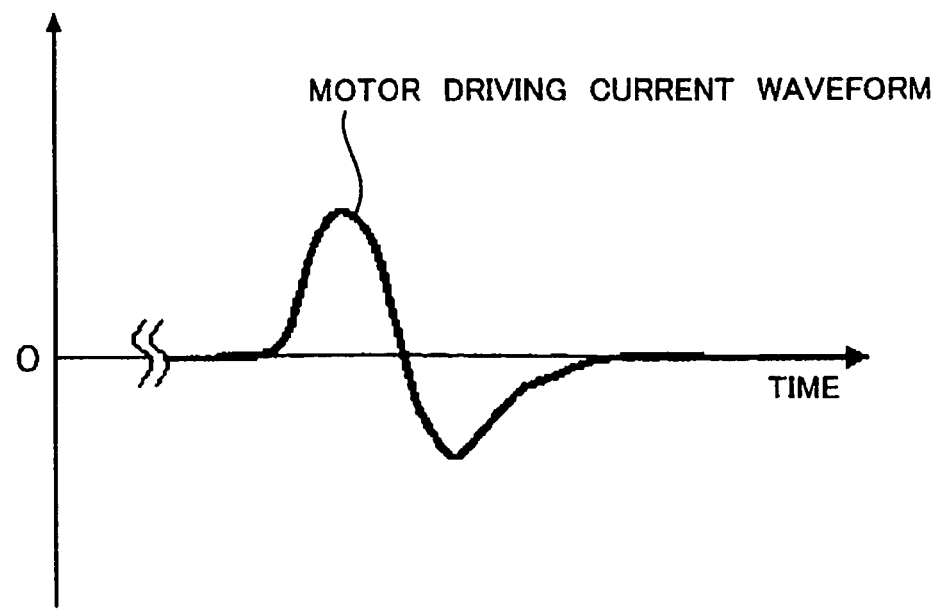

FIGS. 3A and 3B are graphs showing the characteristic of the scanner system according to the present invention. FIG. 3A is a graph showing the response waveform of the mirror angle, and FIG. 3B is a graph showing the motor driving current waveform. On the other hand, FIGS. 4A and 4B are graphs showing the characteristic of a scanner system in the background art, in which the tracking error proportional compensator 25 and the high frequency range stabilization compensator 31 are not provided. FIG. 4A is a graph showing the response waveform of the mirror angle, and FIG. 4B is a graph showing the motor driving current waveform. FIGS. 3A, 3B and 4A, 4B show responses to the angle command value of the same travel angle.

As shown in FIG. 4B, when the tracking error proportional compensator 25 is not provided, a motor driving current rises gradually. On the other hand, when the tracking error proportional compensator 25 is provided, as shown in FIG. 3B, a motor driving current rises steeply. As a result, as shown in FIGS. 3A and 4A, the mirror can be positioned quickly in accordance with the commanded value when the tracking error proportional compensator 25 is provided. It is therefore possible to shorten the machining time.

When the response waveforms of the mirror angles are compared with each other, that in FIG. 3A is settled stably in the same tolerance as that in FIG. 4A and in a shorter positioning time than that in FIG. 4A, due to the effect of the high frequency range stabilization compensator 31.

Here, the operation of the tracking error proportional compensator 25 will be also described as follows. A loop transfer function of the feedback loop in the servo control unit 2 can be defined by cutting (open loop) the loop at a portion of the motor driving current supplied to the scanner 1.

In this case, when the total sums of the proportional coefficients of the tracking error proportional compensator 25 and the proportional compensator 27 are equal, the characteristics of the loop transfer function are the same so that their stability margins are equal. However, the transient response characteristic to an intended trajectory as the closed loop depends on the distribution of the proportional coefficients between the tracking error proportional compensator 25 and the proportional compensator 27. That is, the tracking error proportional compensator 25 is characterized in that the intended value response characteristic can be adjusted without changing the stability of the feedback loop.

As described above, due to the tracking error proportional compensator 25 and the high frequency range stabilization compensator 31 provided in the servo control unit 2, the mirror can be positioned quickly so that the machining speed can be improved.

When the angle commanded value is changed, its frequency spectrum is also changed. As a result, the magnitude of excitation of the natural modes belonging to the feedback loop is changed.

According to the present invention, therefore, control is made as follows, in order to position the mirror more quickly.

That is, according to the present invention, optimal gains corresponding to the travel angles for each of the integral compensator 24, the tracking error proportional compensator 25, the detected value proportional compensator 27 and the detected value differential compensator 28 are prepared in a not-shown storage unit in advance so as to have a desired positioning response characteristic and keep the feedback loop stable. Then, the value of each gain is changed in accordance with the travel angle. Thus, the characteristics of the natural modes are changed over so that the differences in settling responses are suppressed to be low.

When the gain is changed, it is necessary to suppress the occurrence of a transient response caused by the change of the gain. Therefore, the gain must be changed as soon as the value of the gain is established, that is, as soon as a step-like angle commanded value from the upper control unit 4 reaches the servo control unit 2 (immediately before the mirror 12 is moved).

In this event, the detected value proportional compensator 27 acts as a spring restoring force which is proportional to the angle detection signal. When the proportional coefficient is changed, the restoring force is changed discontinuously so that the mirror 12 is fluctuated by a step response. To cancel the step response, a constant value obtained by multiplying the detected value by a coefficient corresponding to a difference of the gain may be subtracted from the output of the proportional compensator 27 as soon as the gain is changed for the first time (when the servo control unit is started up).

When the gain is changed for the second time or later, a value obtained by cumulated sum of the constant value is subtracted from the output of the detected value proportional compensator 27. The constant value generator 33 calculates and cumulates the constant value whenever the gain is changed. Then the constant value generator 33 changes the sign of the cumulated sum value, and outputs it. The output of the constant value generator 33 is added to the output of the detected value proportional compensator 27 in the adder 29. Thus, even when the gain is changed repeatedly, there is no fear that the mirror 12 may be fluctuated by a step response.

In addition, since the output of the detected value differential compensator 28 is substantially zero in the steady state, the mirror 12 makes no response to the change of the gain. In addition, the input of the tracking error integral compensator 24 is a tracking error which is zero in the steady state. Therefore, when a variable gain is provided on the input side, the mirror 12 makes no response to the change of the gain. In addition, since the input of the tracking error proportional compensator 25 is zero in the steady state, the mirror 12 makes no response to the change of the gain.

When the trajectory generator 22 is provided in the upper control unit 4, the trajectory generator 22 does not have to be provided in the scanner system.

When the portion enclosed by the broken line in FIG. 1 is constituted by a single CPU, optimal gains corresponding to travel angles of each of the integral compensator 24, the tracking error proportional compensator 25, the detected value proportional compensator 27 and the detected value differential compensator 28 may be stored in a storage portion of the CPU.

What is claimed is:

1. A scanner system comprising:
a mirror supported on a rotating shaft; and
a servo control unit comprising:
an integral compensating unit for detecting a rotation angle of said rotating shaft, receiving a commanded value from an upper control unit through a trajectory generator, calculating an error by subtracting said detected angular value from said commanded value, and integrating said error;
a detected value proportional compensating unit for proportional compensating said detected angular value; and
a detected value differential compensating unit for differential compensating said detected angular value so as to position the mirror; wherein
said scanner system comprises;
a tracking error proportional compensating unit for calculating a correction value proportional to said error, and;
an add unit for adding an output of said tracking error proportional compensating unit to an output of said integral compensating unit.

2. A scanner system according to claim 1, further comprising:
a stabilization compensating unit for compensating stability of a feedback loop in the frequency range, including one or more than one notch filters corresponding to said torsional resonance peaks to be stabilized, and connected in series, and one or more than one notch filters each having cutoff characteristic at the intermediate frequency range between adjacent ones of said torsional resonance peaks, and said notch filters are connected in series.

3. A scanner system comprising:
a mirror supported on a rotating shaft; and
a servo control unit comprising:
an integral compensating unit for detecting a rotation angle of said rotating shaft, receiving a commanded value from an upper control unit through a trajectory generator, calculating an error by subtracting said detected angular value from said commanded value, and integrating said error;
a detected value proportional compensating unit for proportional compensating said detected angular value; and
a detected value differential compensating unit for differential compensating said detected angular value so as to position the mirror; wherein
a plurality of gains for each compensating unit are defined and stored in a storage unit beforehand corresponding to travel angles of the mirror, and a gain of each compensating unit being changed to said stored gains in accordance with said travel angle depending on said commanded value before said rotating shaft is rotated.

4. A scanner system according to claim 3; wherein
when said correction value obtained by said detected value proportional compensating unit is subtracted from said integrated value, a value obtained by multiplying said detected value by a coefficient corresponding to a difference of said gain is subtracted from an output of said detected value proportional compensating unit so as to change said gain.

* * * * *